(12) United States Patent
Golbus et al.

(10) Patent No.: US 12,315,589 B2
(45) Date of Patent: May 27, 2025

(54) MULTI-VOLTAGE RAM USED TO CROSS CLOCK AND VOLTAGE DOMAINS

(71) Applicant: NVIDIA Corporation, Santa Clara, CA (US)

(72) Inventors: Jason Golbus, Santa Clara, CA (US); Chad Parsons, Santa Clara, CA (US); Kirk Twardowski, Santa Clara, CA (US); Lalit Gupta, Santa Clara, CA (US); Jesse Wang, Santa Clara, CA (US); Ka Yun Lee, Santa Clara, CA (US); Amy Chen, Santa Clara, CA (US); Ramya Challa, Santa Clara, CA (US); Karan Gupta, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 86 days.

(21) Appl. No.: 18/176,836

(22) Filed: Mar. 1, 2023

(65) Prior Publication Data
US 2024/0296875 A1   Sep. 5, 2024

(51) Int. Cl.
*G11C 7/10* (2006.01)
*G11C 8/16* (2006.01)
*G11C 29/50* (2006.01)

(52) U.S. Cl.
CPC .......... *G11C 7/1048* (2013.01); *G11C 7/1075* (2013.01); *G11C 8/16* (2013.01); *G11C 29/50004* (2013.01); *G11C 29/50012* (2013.01); *G11C 2029/5004* (2013.01)

(58) Field of Classification Search
CPC ................ G11C 7/1048; G11C 7/1075; G11C 29/50004; G11C 29/50014; G11C 2029/5004; G11C 8/16
See application file for complete search history.

(56) References Cited

U.S. PATENT DOCUMENTS

| | | | |
|---|---|---|---|
| 9,396,790 B1 * | 7/2016 | Chhabra | G11C 11/417 |
| 9,633,716 B2 * | 4/2017 | Kulkarni | G11C 5/147 |
| 10,854,284 B1 * | 12/2020 | Chuang | G11C 11/412 |
| 2018/0342289 A1 | 11/2018 | Kulkarni et al. | |
| 2024/0395293 A1 | 11/2024 | Gupta et al. | |

* cited by examiner

*Primary Examiner* — Son L Mai

(57) ABSTRACT

The disclosure provides improvements for transmitting data between different voltage domains of an IC, such as a chip. The disclosure introduces a data transfer circuit that uses a multi-voltage RAM, referred to herein as MVRAM, for transmitting data across the different voltage domains. The MVRAM has multiple memory cells with write ports and read ports on different clock and voltage domains. Accordingly, a write operation can occur completely on the write domain voltage and the read operation can occur completely on the read domain voltage. In one example, the data transfer circuit includes: (1) write logic operating at a first operating voltage, (2) read logic operating at second operating voltage, and (3) a MVRAM with write ports that operate under the first operating voltage and read ports that operate under the second operating voltage.

22 Claims, 5 Drawing Sheets

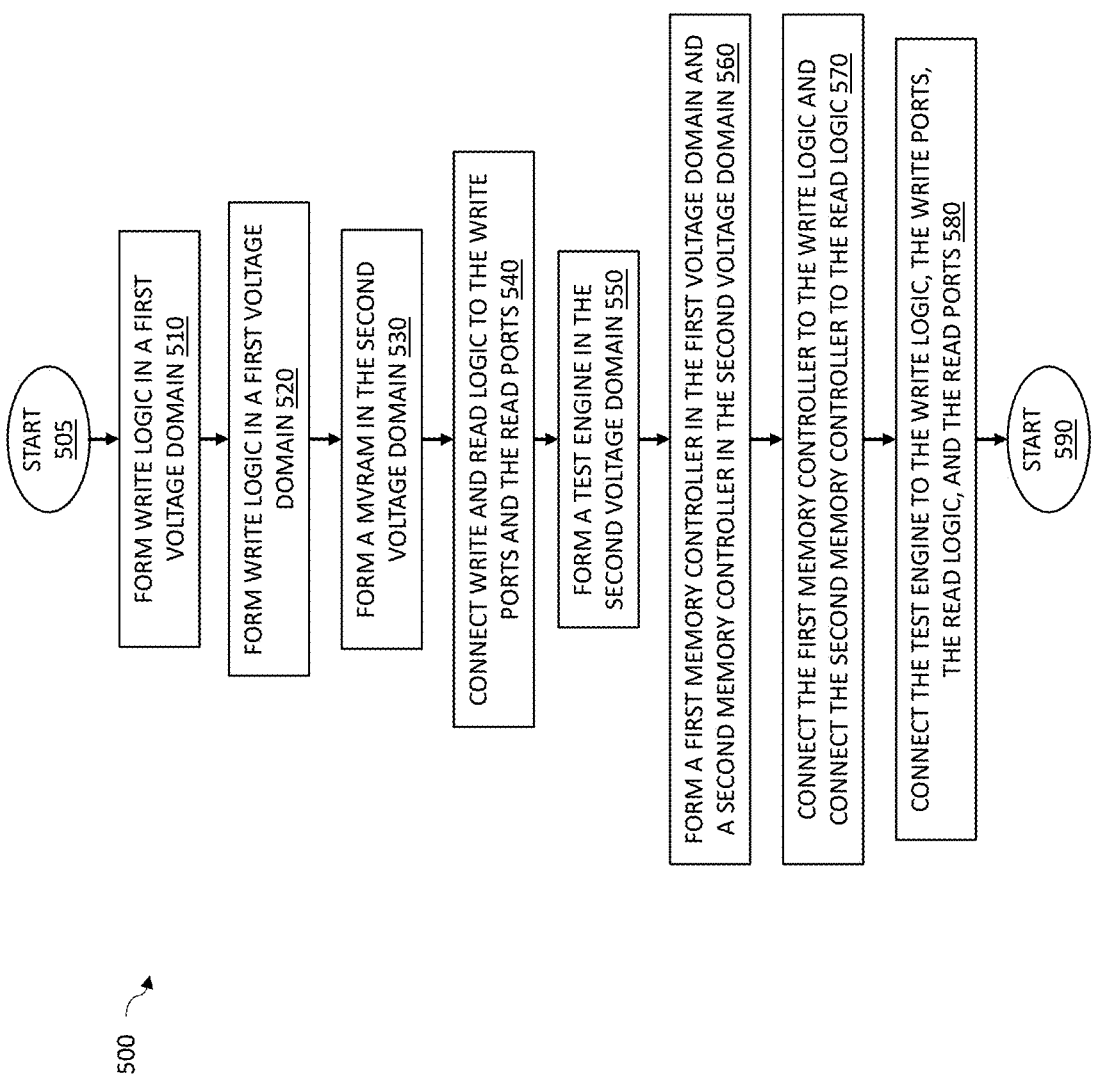

MULTI-VOLTAGE RAM USED TO CROSS CLOCK AND VOLTAGE DOMAINS

TECHNICAL FIELD

This application is directed, in general, to communicating data on integrated circuits (ICs) and, more specifically, to transmitting data across IC domains having different voltages and clocks.

BACKGROUND

ICs typically include different partitions that operate on different clock and/or voltage domains. The different clock domains can have independent frequencies that are unrelated to each other. In other words, the different clocks can be faster or slower. The different voltage domains can also be independent of each other. For example, the different voltages can vary between Vmin and Vmax. Accordingly, each of the frequencies and voltages can be dynamic.

Often large amounts of data needs to be transferred from one domain to another domain. When both domains operate at the same voltage, the crossing can be done with an asynchronous first in, first out (FIFO) buffer. With an asynchronous FIFO buffer, the write side and read side are on different clock domains and external pointer control logic makes sure that the FIFO buffer (or simply FIFO) never overflows (i.e., written when full) or underflows (i.e., read when empty). When the domains also operate on different voltages, additional circuitry is required, such as level shifters, for the data transfers.

SUMMARY

One aspect provides an IC. In one example the IC includes: (1) a first domain that operates at a first voltage, (2) a second domain that operates at a second voltage different than the first voltage, and (3) a multi-voltage dual-port memory (MVRAM) with write ports that operate under the first voltage and read ports that operate under the second voltage.

In another aspect a data transfer circuit for communicating between two different voltage domains is disclosed. In one example, the data transfer circuit includes: (1) write logic operating at a first operating voltage, (2) read logic operating at second operating voltage, and (3) a MVRAM with write ports that operate under the first operating voltage and read ports that operate under the second operating voltage.

In yet another aspect, the disclosure provides a method of manufacturing. In one example, the method includes: (1) forming write logic in a first voltage domain that operates at a first operating voltage, (2) forming read logic in a second voltage domain that operates at a second operating voltage, (3) forming a MVRAM in the second voltage domain having write ports that operate at the first operating voltage and read ports that operate at the second operating voltage, and (4) connecting the write logic to the write ports and the read logic to the read ports.

In still another aspect, another IC is disclosed. In one example this IC includes: (1) a first domain that operates at a first voltage, and (2) a second domain that operates at a second voltage different than the first voltage and includes a MVRAM with write ports that operate under the first voltage and read ports that operate under the second voltage.

BRIEF DESCRIPTION

Reference is now made to the following descriptions taken in conjunction with the accompanying drawings, in which:

FIG. 5 illustrates a flow diagram of an example method of manufacturing an IC carried out according to the principles of the disclosure.

DETAILED DESCRIPTION

Using the additional circuitry for transmitting data from a one voltage domain to another voltage domain results in an increase in memory area. For example, an n×m asynchronous FIFO requires n×m level shifters to shift the memory contents from one voltage domain to the other voltage domain. Memory area may be improved by modifying the FIFO but this could increase the cost of power. Additionally, the voltages in each of the different power domains can change, which makes meeting timing constraints for transferring data difficult.

Figure 3:
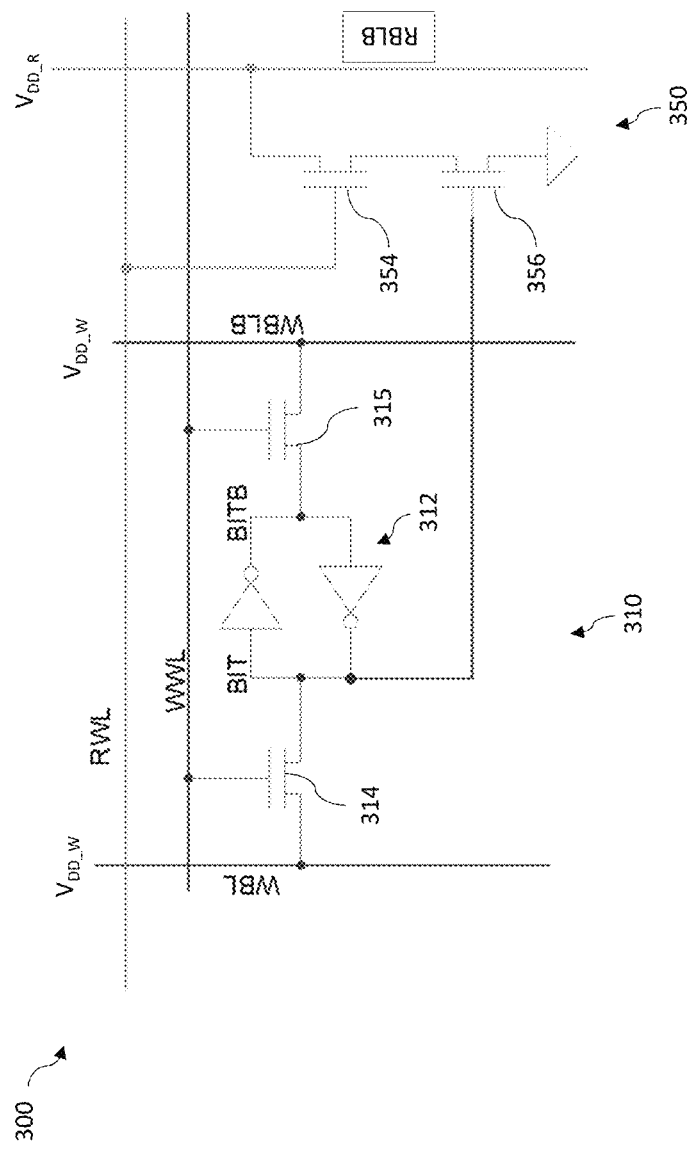
FIG. 3 illustrates a schematic of an example of a memory cell that can be used in a MVRAM constructed according to the principles of the disclosure.

The disclosure provides an apparatus and system for improving the transmission of data between different voltage domains of an IC, such as a chip. The disclosure introduces a data transfer circuit that uses a multi-voltage RAM, referred to herein as MVRAM, for transmitting data across the different voltage domains. The MVRAM has multiple memory cells with write ports and read ports on different clock and voltage domains. Accordingly, a write operation can occur completely on the write domain voltage and the read operation can occur completely on the read domain voltage. The memory cells can be an 8 t bitcell, such as shown in FIG. 3. The MVRAM can be located within the read voltage domain, such as illustrated in FIG. 1.

Figure 1:
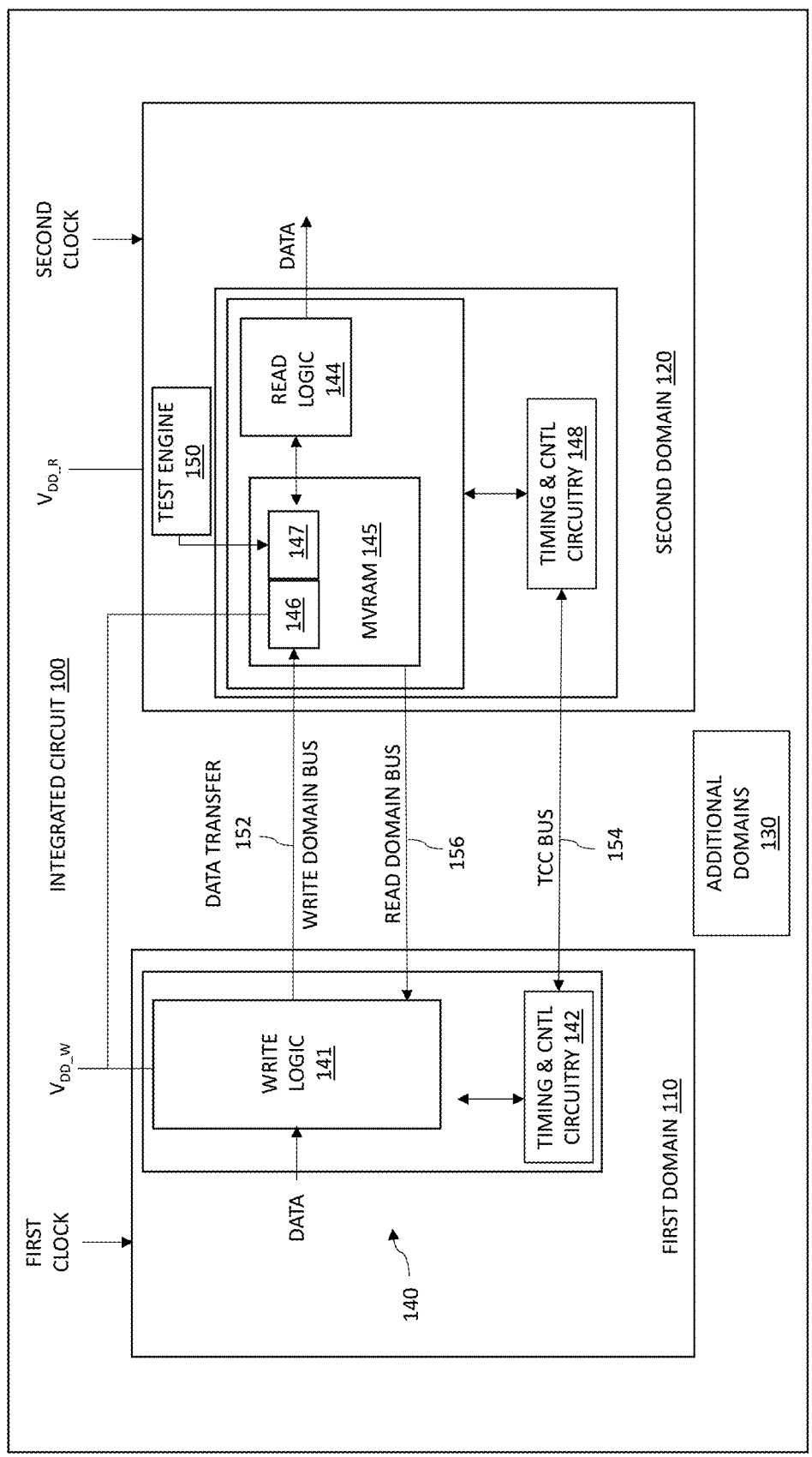
FIG. 1 illustrates a block diagram of an integrated circuit constructed according to the principles of the disclosure.

FIG. 1 illustrates a block diagram of an IC 100 constructed according to the principles of the disclosure. The IC 100 includes at least two domains, represented by first domain 110 and second domain 120, which operate under different clocks and voltages. The IC 100 can include additional domains and other components typically included with an IC, which is represented by additional domains 130. In FIG. 1, the first domain 110 is the write domain that operates under a write domain voltage, $V_{DD\_W}$, and the second domain 120 is the read domain that operates under a read domain voltage, $V_{DD\_R}$. $V_{DD\_W}$ and $V_{DD\_R}$ are separate voltages provided on different voltage rails and one or both of the voltages can be dynamic. The different clocks, represented by first clock and second clock in FIG. 1, can also be dynamic with independent frequencies, such that either one of the first clock or the second clock can be faster or slower. The IC 100 includes a data transfer circuit 140 for transferring data from the first domain 110 to the second domain 120. Both the first domain 110 and the second domain 120 include a portion of the data transfer circuit 140.

Figure 4:
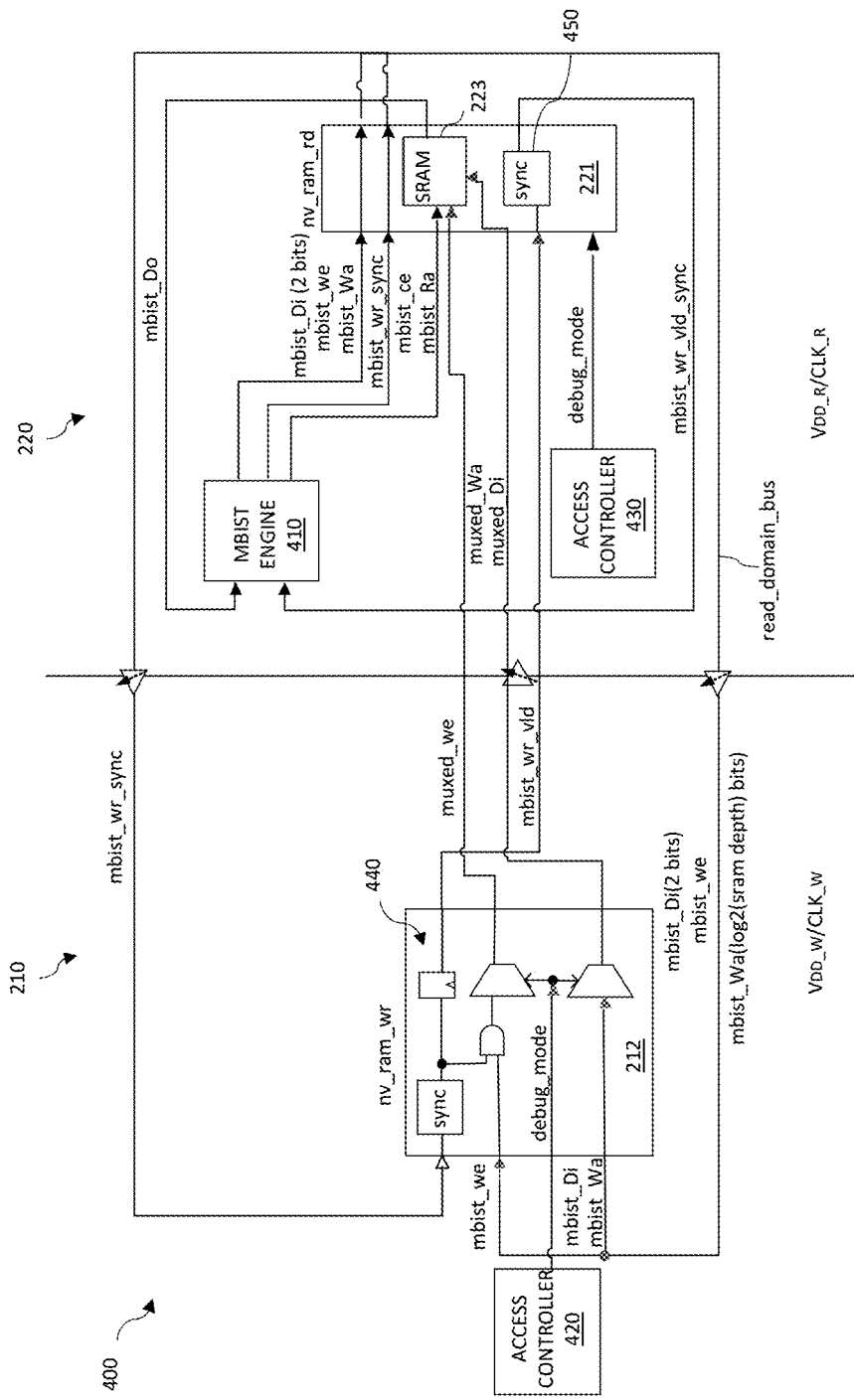
FIG. 4 illustrates a schematic diagram of an example test circuit for use with a data transfer circuit constructed according to the principles of the disclosure.

In the first domain 110, the data transfer circuit 140 includes write logic 141 and timing and control circuitry (TCC) 142. In the second domain 120, the data transfer circuit 140 includes read logic 144, MVRAM 145, and TCC 148. The MVRAM 145 includes memory cells with write ports that operate under the write domain voltage and read ports that operate under the read domain voltage. The write and read ports of the memory cells are represented in FIG. 1 by write ports 146 and read ports 147. Components of the data transfer circuit 140 in the first and second domains 110, 120, communicate via write domain bus 152 and TCC bus 154. An additional bus, read domain bus 156, is connected to test engine 150 and is used for testing. The test engine 150 is on the second domain 120 and sends write address, write enable, and data back to the first domain 110 on the read domain bus 156 using level-shifters. The test engine 150 is also connected to the MVRAM 145 without using level-shifters since both are in the same voltage domain. As used as an example herein, the test engine 150 can be a memory built-in self test (mbist) engine or another type of self-testing circuit. Although the write domain bus 152 used for data may be wide, the read domain bus 156 can be narrower, which decreases the number of level-shifters needed. FIG. 4 provides an example of an mbist engine connected to write logic via a read domain bus for communicating two bits of mbist Data In (Di). In addition to a read domain bus, FIG. 2 also includes a write domain bus, such as write domain bus 152.

The write logic 141 is configured to receive data to send to the second domain 120, process the data for transmission, and send the data over the write domain bus 152 to the MVRAM 145 with a write address and write enable signal. Advantageously, the write domain bus 152 does not use a level-shifter since the write logic 141 and the write ports 146 both operate at the write domain voltage, i.e., both are connected to $V_{DD\_W}$. The write logic 141 can receive the data from logic circuitry (not shown) of the first domain 110. The write address identifies the memory cell of the MVRAM 145 to receive the data and the write enable signal permits the data to be written to the particular write port 146 of the identified memory cell.

The read logic 144 is configured to receive a memory cell address of data to access, identify the memory cell, activate an enable read signal, and retrieve the data from the read port 147 of the identified memory cell. The data can then be provided to logic circuitry (not shown) of the second domain 120.

Figure 2:
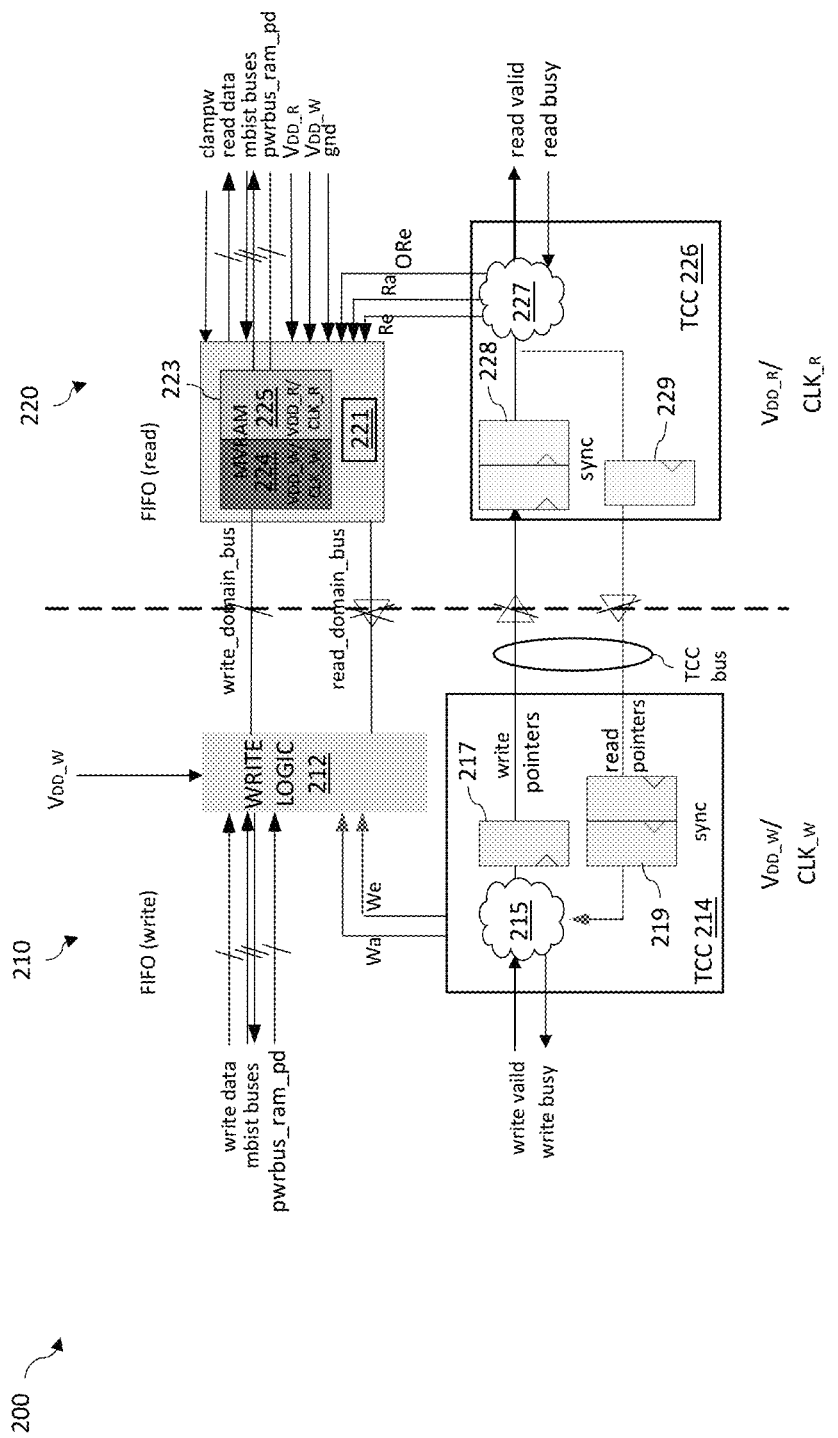
FIG. 2 illustrates a schematic diagram of an example of a data transfer circuit constructed according to the principles of the disclosure.

The TCC 142, 148, coordinate timing and control signals for transferring data from the first domain 110 to the second domain 120. The TCC 142, 148, communicate via the TCC bus 154. The TCC bus 154 represents two separate busses having level-shifters for sending data from the TCC 142 to the TCC 148 and from the TCC 148 to the TCC 142. FIG. 2 illustrates an example of a data transfer circuit as disclosed herein, such as data transfer circuit 140, being used as a split FIFO that illustrates the two busses and an example of the TCC 142, 148, that can be used for writing and reading using a MVRAM. A split FIFO has a write side and a read side that operate in different voltage domains and different clocks.

FIG. 2 illustrates a schematic diagram of an example of a data transfer circuit 200 constructed according to the principles of the disclosure. The data transfer circuit 200 operates as a split FIFO having a write side and a read side that operate in two different voltage domains, write portion 210 and read portion 220, and also operate under different clocks, such as the first domain and the second domain 110, 120, of FIG. 1. The write portion 210 includes write logic 212 and TCC 214. The read portion 220 includes read logic 221, MVRAM 223, and TCC 226. MVRAM 223 includes write ports 224 and read ports 225. The data transfer circuit 200 and the IC 100 can be used in various systems, such as mobile devices, desktop computers, rack-mounted compute nodes in data centers, and autonomous machines. The autonomous machines can include, for example, vehicles, vision systems, and robots. The mobiles devices can be, for example, smart phones, computing pads, and gaming devices.

The write logic 212 receives data at a write port to write to read portion 220; more specifically to one of the write ports 224, via the write domain bus. The write logic 212 is also connected to control busses, a power bus and mbist busses, which are commonly used with a FIFO. Similar to the write logic 212, the read logic 221 is also connected to control busses, a power bus and mbist busses, which are commonly used with a FIFO. Unlike the read logic 221, the mbist busses connect the write logic 212 to an mbist engine (not shown in FIG. 2) via level shifters, as represented by the read domain bus in FIG. 2. FIG. 4 shows additional details of an mbist engine and mbist bus connections used with a data transfer circuit such as illustrated in FIG. 2.

The read logic 221 is also connected to a read bus that presents data read from read ports 225 of the MVRAM 223. The power provided for the read portion 220, $V_{DD\_R}$ and ground, and also the power provided to the write ports 224 of MVRAM 223, $V_{DD\_W}$, are also shown. Additionally, read logic 221 is connected to a clamp signal represented by clampw. If $V_{DD\_R}$ is on and $V_{DD\_W}$ is off, the contents of the MVRAM 223 are undetermined and reads need to be prevented. In one example the clamp signal clampw can be used. The clamp signal clampw can be distributed asynchronously on $V_{DD\_R}$ rail and used to gate off the read wordlines.

The TCC 214 and the TCC 226 provide an interface to external logic for the data transfer circuit 200, such as logic located within the first domain 110 and the second domain 120 of FIG. 1. The TCC 214 includes logic circuit 215 and logic elements, 217 and 219, which are generally used for communicating that the data has been written and that data has been read. The logic circuit 215 is connected to two busses that receive a write valid and a write busy signal that are used when pushing data onto the data transfer circuit 200. Write_valid is an input indicating the external logic has data ready to be input into the FIFO for transfer. Write_busy is an output that says that the FIFO is full and cannot take any data.

When data is to be transferred, data is presented to the write logic 212 and the write valid signal is asserted. In addition, a write address (Wa) signal and a write enable (We) signal are provided via the TCC 214. As long as the write busy signal is deasserted, the data will be pushed to the read portion 220. The logic circuit 215 also sends write pointers to TCC 226 using logic element 217. Similarly, logic element 219 receives read pointers from TCC 226 and provides these to the logic circuit 215.

TCC 226 also includes a logic circuit, logic circuit 227, and logic elements 228, 229, which also are generally used for communicating that data has been written and that data has been read. Logic circuit 227 is connected to a read valid and a read busy bus. Read_valid is an output that indicates the FIFO has valid data for the external logic to receive. Read_busy is an input that says the external logic cannot receive any data and the FIFO should hold onto the data until the external logic is not busy and can receive the data. The valid and busy signals for the read and also for the write are standard ready/valid handshake protocols. Logic circuit 227 provide a read address (Ra) and a read enable (Re) signal to the read logic 221. Logic circuit 227 also provides an output read enable (ORe) that is used to clock a flop that captures the output of the read data bus.

Once the read portion 220 knows that there is data present in MVRAM 223, read valid signal is asserted to indicate there is valid data in the MVRAM 223 to read. When the read valid signal is asserted, the data read from read ports 225 will be present on the output port. Provided that the read busy signal is deasserted, then the read data transaction will occur and the data will be output from the MVRAM 223.

FIG. 3 illustrates a schematic of an example of a memory cell 300 that can be used in a MVRAM constructed according to the principles of the disclosure, such as MVRAM 145 and 223 of FIGS. 1 and 2. Memory cell 300 includes a write port 310 and read port 350 that are on different voltage and clock domains. The only place where the voltage domains interact is in a second transistor 356 of the read port 350 as shown in FIG. 3.

The write port 310 includes storage node 312 and write pass gates 314, 315, that are on the write domain ($V_{DD\_W}$, in red). The 2 T read port 350 is on the read domain ($V_{DD\_R}$) and includes a first transistor 354 and a second transistor 356. The storage node BIT from storage node 312 is used to control transistor 356 and drive the pulldown of the read port.

Advantageously, the entire write operation occurs on the write domain voltage. WBL and WBLB are driven to opposite values ($0/V_{DD\_W}$ or $V_{DD\_W}/0$). For a write operation, WWL is driven to $V_{DD\_W}$ and the storage node 312 stores either a 1 (BIT=$V_{DD\_W}$, BITB=0) or a 0 (BIT=0, BITB=$V_{DD\_W}$).

For a read operation, RBL is precharged to $V_{DD\_R}$ by a pmos device (not shown). When precharge is complete, the pmos precharge is shut off and RWL is driven to $V_{DD\_R}$. If the storage node 312 is storing a 1 (BIT=$V_{DD\_W}$), the RBL will be pulled down to 0. This is true no matter what the value of $V_{DD\_W}$ is relative to $V_{DD\_R}$. If the storage node is storing a 0, (BIT=0), the RBL will remain at the $V_{DD\_R}$ precharge level. A simple inverter can be used as a sensing circuit to sense the value on RBL.

Because the RBL is floating high when reading a 0, a pmos keeper is required to prevent RBL from leaking low. To improve timing, a gated keeper can be used. This type of keeper will not be turned on during evaluation, but will turn on a short time afterwards. Getting the timing of this keeper correct can be handled in various ways, including as described in U.S. patent application Ser. No. 18/323,997, which is incorporated herein by reference.

As noted above, $V_{DD\_W}$ and $V_{DD\_R}$ are independent voltages operating on different voltage rails. Since the $V_{DD\_W}$ and $V_{DD\_R}$ rails are independent, either can be on while the other is off, and the MVRAM must be able to tolerate this. Accordingly, the data transfer circuits using the MVRAM are configured to tolerate one power supply being on and the other supply being off.

If $V_{DD\_R}$ is on and $V_{DD\_W}$ is off, the contents of the MVRAM are undetermined and reads need to be prevented. As shown in FIG. 2, a clamp signal clampw can be used.

If $V_{DD\_W}$ is on and $V_{DD\_R}$ is off, nothing special needs to be done inside the array of memory cells of the MVRAM. There are no signals travelling from $V_{DD\_R}$ domain to $V_{DD\_W}$. FIG. 4 illustrates a schematic diagram of an example test circuit 400 for use with a data transfer circuit constructed according to the principles of the disclosure. The test circuit 400 can be a design for test (DFT)/mbist test circuit. As an example, the test circuit 400 is shown with respect to the data transfer circuit 200 of FIG. 2, wherein the same elements are used for the same components. With the MVRAM 223 of the data transfer circuit 200, both the read and write sides need to talk to a test engine on a single voltage domain for testing, which requires additional mbist specific level-shifters. Using level-shifters dedicated for testing, however, reduces the benefit of transferring data between the two voltage domains without using level-shifters, such as in data transfer circuit 200. Advantageously, test circuit 400 places the test logic, which is an mbist engine 410 in this example, on one domain side, the read side, and uses a narrow two-bit wide data bus for the write side in order to keep crossing of the voltage rails at a minimum. Having the mbist engine 410 on the read side allows seeing the entire width of the read data and only a few mbist signals need to cross voltage domains, such as mbist RAM inputs (Mbist_di, Mbist_we, Mbist_wa). Mbist_wa can vary based on the depth of the MVRAM 223 and Mbist_di may only be two bits wide instead of a full data bus. In addition to the memory inputs Mbist_di, Mbist_we, and Mbist_wa, other signals typically used for mbist testing are identified in FIG. 4, such as mbist_wr_sync and mbist_wr_vld that are handshaking signals indicating when writes can happen.

With the single in mbist engine 410, two RAM access controllers are used with one located in one voltage domain and the other one located in the other voltage domain. FIG. 4 illustrates the DFT connectivity and modules of the test circuit 400 located outside of the read and write wrapper logic of data transfer circuit 200 of FIG. 2.

In addition to the mbist engine 410, the test circuit 400 includes access controller 420 on the write portion 210 and access controller 430 on the read portion 220. The test circuit 400 also uses hardware logic, generally denoted as test logic 440, 450, for testing that is located within the write logic 212 and the read logic 221. The test logic 440, 450, includes components that are typically used for mbist testing and memory access.

The Mbist engine 410 includes a testing algorithm for testing the MVRAM 223. The testing algorithm can be an algorithm that is typically used in the industry for testing RAM. The access controllers 420, 430, are used to access locations of the MVRAM 223 once a bug has been detected by the mbist engine 410. The access controllers 420, 430, each access a single voltage domain of the MVRAM 223. Access controller 420 is used to access the write side and access controller 430 is used to access the read side. Accordingly, access controller 420 places the write side in debug mode and access controller 430 places the read side in debug mode. As with typical memory debugging, access controllers 420, 430, are used to manually place the respective write and read sides in debug mode.

Once in debug mode, access controller 420 can control address and enable signals for the write portion of MVRAM 223 and connect to scan registers (not shown) located in the write logic 212 to set-up an operation for debugging. Similarly, access controller 430 can control address and enable signals for the read portion of MVRAM 223 and connect to scan registers (not shown) located in the read logic 221 to set-up an operation for debugging.

FIG. 5 illustrates a flow diagram of an example method 500 of manufacturing an IC carried out according to the principles of the disclosure. The IC can be the IC of FIG. 1 and include a data transfer circuit such as illustrated in FIG. 2 and a test circuit such as illustrated in FIG. 4. The IC can be formed in silicon using manufacturing techniques of the industry. The method 500 begins in step 505.

In step 510, write logic is formed in a first voltage domain that operates at a first operating voltage. In step 520 read logic is formed in a second voltage domain that operates at a second operating voltage. The first and second operating voltages are different. The operating frequencies of the first and second voltage domains can also be different. One or more of the different operating voltages and frequencies can be dynamic. In addition to the first and second voltage domains, the IC can also include additional voltage domains and components besides the first and second voltage domains.

A multi-voltage dual-port memory (MVRAM) is formed in the second voltage domain in step 530. The MVRAM includes write ports that operate at the first operating voltage and read ports that operate at the second operating voltage.

In step 540, the write logic is connected to the write ports and the read logic is connected to the read ports. The connections can be busses for communicating data, such as writing data to and reading data from the MVRAM. No level shifters are not needed for writing to the write ports or reading from the read ports.

A test circuit is also added to the IC. The test circuit can be, for example, the test circuit 400 of FIG. 4. Accordingly, a test engine is formed in the second domain in step 550. The test engine can be mbist engine. In step 560 a first memory access controller is formed in the first voltage domain and a second memory access controller is formed in the second voltage domain.

In step 570, the first memory access controller is connected to the write logic and the second memory access controller is connected to the read logic. The test engine is also connected to the write and read logic, and to the write and read ports in step 580. Additional connections can also be made such as illustrated in FIGS. 1 to 4. The method 500 continues to step 590 and ends.

A portion of the above-described apparatus, systems or methods may be embodied in or used for various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media or non-transitory computer-readable medium, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

The digital data processors or computers can be comprised of one or more processing units. The processing unit may include one or more GPUs, one or more CPUs, one or more hardware accelerators, e.g., a deep learning accelerator, a vision processing unit, and a tensor processing unit, one or more of other processor types, or a combination thereof. The digital data processors and computers can be located proximate each other, proximate a user, in a cloud environment, a data center, or located in a combination thereof. For example, some components can be located proximate the user and some components can be located in a cloud environment or data center. The processing units can include one or more of the circuits or circuitry disclosed herein.

The processing units in the processors or computers, such as GPUs, can be embodied on a single semiconductor substrate, included in a system with one or more other devices such as additional GPUs, a memory, and a CPU. The GPUs may be included on a graphics card that includes one or more memory devices and is configured to interface with a motherboard of a computer. The GPUs may be integrated GPUs (iGPUs) that are co-located with a CPU on a single chip. Configured or configured to means, for example, designed, constructed, or programmed, with the necessary logic and/or features for performing a task or tasks.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions, and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of examples are described herein. It is noted that as used herein and in the appended claims, the singular forms "a", "an", and "the" include plural referents unless the context clearly dictates otherwise.

Each of the aspects disclosed in the Summary may have one or more of the additional features of the dependent claims in combination.

What is claimed is:

1. An integrated circuit (IC), comprising:
a first domain that operates at a first voltage;
a second domain that operates at a second voltage different than the first voltage; and
a multi-voltage dual-port memory (MVRAM) with write ports that operate under the first voltage and read ports that operate under the second voltage, wherein the MVRAM is located in the second domain and the first domain includes write logic connected to the write ports via a write domain bus.

2. The IC as recited in claim 1, wherein a clock frequency of the first domain is different than a clock frequency of the second domain.

3. The IC as recited in claim 1, wherein the MVRAM includes multiple memory cells and the write ports for each of the memory cells has a storage node and write pass gates.

4. The IC as recited in claim 3, wherein the MVRAM includes multiple memory cells and the read ports for each of the memory cells has a read port.

5. The IC as recited in claim 1, wherein the write logic is connected to the write ports in the second domain via a write domain bus.

6. The IC as recited in claim 1, further comprising a test circuit having a test engine located in the second domain, a first access controller in the first domain to access the write ports, and a second access controller in the second domain to access the read ports.

7. The IC as recited in claim 6, wherein the test engine is configured to test both the write ports and the read ports.

8. The IC as recited in claim 6, wherein the test engine is connected to the write ports via level-shifted connections.

9. The IC as recited in claim 1, wherein the read ports are controlled by a clamp signal that prevents a read when the read ports are powered-on and the write ports are powered off.

10. The IC as recited in claim 1, wherein one or more of the first voltage and the second voltage are dynamic voltages.

11. The IC as recited in claim 2, wherein one or more of the clock frequency of the first domain and the clock frequency of the second domain are dynamic frequencies.

12. A data transfer circuit for communicating between two different voltage domains, comprising:
   write logic operating at a first operating voltage;
   read logic operating at second operating voltage; and
   a multi-voltage dual-port memory (MVRAM) with write ports that operate under the first operating voltage and read ports that operate under the second operating voltage, wherein the write logic is located in a first one of the different voltage domains and the MVRAM is located in a second one of the different voltage domains.

13. The data transfer circuit as recited in claim 12, further comprising a write domain bus that connects the write logic to the write ports.

14. The data transfer circuit as recited in claim 12, wherein the read logic is located in the second one of the different voltage domains.

15. The data transfer circuit as recited in claim 12, wherein the MVRAM includes multiple memory cells and the read ports for each of the memory cells includes two transistors connected in series, wherein the two transistors are connected to the second operating voltage.

16. The data transfer circuit as recited in claim 15, wherein the MVRAM includes multiple memory cells and the write ports for each of the memory cells has a storage node and write pass gates connected to the first operating voltage, wherein one of the two transistors is controlled by the storage node.

17. The data transfer circuit as recited in claim 15, wherein the read ports are controlled by a clamp signal that prevents a read when the read ports are powered-on and the write ports are powered off.

18. A chip including at least one data transfer circuit as recited in claim 12.

19. An autonomous machine comprising one or more chips as recited in claim 18.

20. A method of manufacturing an integrated circuit, comprising:
   forming write logic in a first voltage domain that operates at a first operating voltage;
   forming read logic in a second voltage domain that operates at a second operating voltage;
   forming a multi-voltage dual-port memory (MVRAM) in the second voltage domain having write ports that operate at the first operating voltage and read ports that operate at the second operating voltage; and
   connecting the write logic to the write ports and the read logic to the read ports.

21. The method as recited in claim 20, further:
   forming a test engine in the second voltage domain;
   forming a first memory access controller in first voltage domain;
   forming a second memory access controller in the second voltage domain;
   connecting the first memory access controller to the write logic and connecting the second memory access controller to the read logic; and
   connecting the test engine to the write ports and the read ports.

22. An integrated circuit (IC), comprising:
   a first domain that operates at a first voltage and includes write logic; and
   a second domain that operates at a second voltage different than the first voltage and includes a multi-voltage dual-port memory (MVRAM) with write ports that are connected to the write logic and operate under the first voltage and read ports that operate under the second voltage.

* * * * *